United States Patent [19]
Takita

[11] Patent Number: 6,064,259
[45] Date of Patent: May 16, 2000

[54] HIGH POWER, HIGH PERFORMANCE PULSE WIDTH MODULATION AMPLIFIER

[75] Inventor: Mark K. Takita, Palo Alto, Calif.

[73] Assignee: Nikon Corporation of America, Tokyo, Japan

[21] Appl. No.: 09/121,931

[22] Filed: Jul. 24, 1998

[51] Int. Cl.⁷ ...................................................... H03F 3/38
[52] U.S. Cl. ........................................ 330/10; 330/207 A
[58] Field of Search ................................. 330/10, 207 A, 330/251

[56] References Cited

U.S. PATENT DOCUMENTS

| | | | |
|---|---|---|---|
| 4,016,501 | 4/1977 | Jasinski et al. | 330/10 |
| 4,059,807 | 11/1977 | Hamada | 330/10 |
| 4,464,630 | 8/1984 | Eddins | 330/107 |
| 4,564,818 | 1/1986 | Jones | 330/311 |
| 4,724,396 | 2/1988 | Taylor, Jr. et al. | 330/10 |
| 5,030,925 | 7/1991 | Taylor | 330/308 |
| 5,055,799 | 10/1991 | Calton | 330/297 |
| 5,061,865 | 10/1991 | Durst | 307/490 |
| 5,075,608 | 12/1991 | Erdman et al. | 318/599 |
| 5,079,494 | 1/1992 | Reichard | 318/811 |
| 5,481,446 | 1/1996 | Timmins | 363/41 |
| 5,805,020 | 9/1998 | Danz et al. | 330/10 |
| 5,838,193 | 11/1998 | Myers et al. | 330/10 |

*Primary Examiner*—Robert Pascal
*Assistant Examiner*—Henry Choe
*Attorney, Agent, or Firm*—Skjerven, Morrill, MacPherson, Franklin and Friel; Michael J. Halbert

[57] ABSTRACT

A high performance pulse width modulation amplifier system employing an H-bridge amplifier connected to a carrier wave output filter produces a pulsed wave signal with high power transfer efficiency and low total harmonic distortion characteristics. A carrier wave output filter used with the pulse width modulation amplifier system produces little peak resonance at low frequencies.

15 Claims, 15 Drawing Sheets

| FIG. 8-1 | FIG. 8-2 |

HIGH POWER, HIGH PERFORMANCE PULSE WIDTH MODULATION AMPLIFIER

FIELD OF THE INVENTION

The present invention relates to pulse modulation amplifier systems, and in particular to high power amplifier systems using pulse width modulation to control high performance motion control systems.

BACKGROUND

Pulse modulation amplifiers are commonly used to supply drive current to inductive loads, such as linear, voice-coil, and DC motors, using pulse width modulation (PWM). A pulse modulation amplifier, such as a PWM amplifier, receives an analog waveform and outputs a square wave pulse. The square wave pulse has an amplitude and duration such that the integrated energy of the pulse is equivalent to the energy of the sampled input analog waveform multiplied by a gain factor created by the amplifier.

The resulting PWM waveform may be filtered to produce an analog waveform replicating the original input waveform multiplied by the gain factor. Typically, the inherent electrical or mechanical frequency response of the controlled system, such as an electric motor, performs the filter function.

Where a filter circuit is used in a controlled system, a basic inductor capacitor (LC) filter or a Cauer-Chebyshev (C-C) filter circuit may be used. FIG. 14 shows a conventional C-C filter 10 using a current source 11, two inductors 12 and 14 in series between the voltage input $V_{in}$ and output $V_{out}$. A third inductor 16 is connected to ground and between inductors 12 and 14. A capacitor 18 is disposed between inductor 16 and ground, while a second capacitor 20 and a load resistor 22 connect output $V_{out}$ to ground. However, conventional filters such as a LC filter or a C-C filter, as shown in FIG. 14, have undesirably high resonance peaks at low frequencies. FIG. 15 is a plot showing the peak resonance characteristics of C-C filter 10 relative to frequency. As shown in FIG. 15, there is an approximate 8.5 dB peak resonance at 10 KHz. Commonly, an increase of resistance in series with the inductor of an LC filter, may be used to lower the peak resonance, however, that decreases efficiency and dissipates heat.

In a conventional motor drive system, motor control is generally considered non-critical and thus a smooth drive current is not a concern. Further, currently available motor drive systems are unconcerned with total harmonic distortion (THD) characteristics, which cause noise and generate excessive undershoot or overshoot ringing effects. Where a controlled system requires a high degree of precision, however, the amplifier system must be highly linear. For instance, photolithographic systems require high resolution when in the scanning mode. Further, power transfer efficiency is important in systems that require generation of large acceleration and deceleration forces, for instance in a stepping mode to rapidly change positions of the system. Thus, a high performance motion control system requires a high degree of linearity in scanning mode and high power transfer efficiency when in stepping mode.

Although analog amplifier systems typically are more linear, less noisy, and exhibit less distortion than equivalent PWM amplifier systems, analog amplifier systems suffer from poor power transfer efficiency, which creates heat. Conventional PWM amplifier systems, on the other hand, do not provide drive current in a linear fashion and typically have poor THD characteristics. Thus, conventional PWM amplifier systems are inadequate to produce the high degree of precision and power transfer efficiency required by current high performance motion control systems.

SUMMARY

The present invention is directed to a pulsed wave amplifier circuit that has a high power transfer efficiency with low THD characteristics. The pulsed wave amplifier circuit of the present invention uses a high accuracy triangle wave generator, which provides a highly linear triangle sampling reference for a comparator and pulse generator.

The pulsed signals produced by the comparator and pulse generator are received by a MOSFET transistor bridge, such as a low harmonic distortion H-bridge amplifier. The low harmonic distortion H-bridge amplifier uses fast surge suppression to prevent output ringing in the H-bridge amplifier's output signals. The output signals from the H-bridge amplifier are received by a carrier wave output filter, which removes and dissipates the energy from the carrier waves. Without the dissipation of the energy in the carrier wave output filter, the carrier wave energy would heat the mechanism in the linear motors, which is undesirable. The carrier wave output filter thus provides an analog current signal to the linear motor.

A current sensing circuit also receives the analog current signal from the carrier wave output filter and provides an analog current feedback signal, which is received by a proportioning and integration circuit. The analog current feedback signal is used to stabilize and flatten the voltage to current transfer characteristics of the amplifier system.

DETAILED DESCRIPTION

Figure 1:
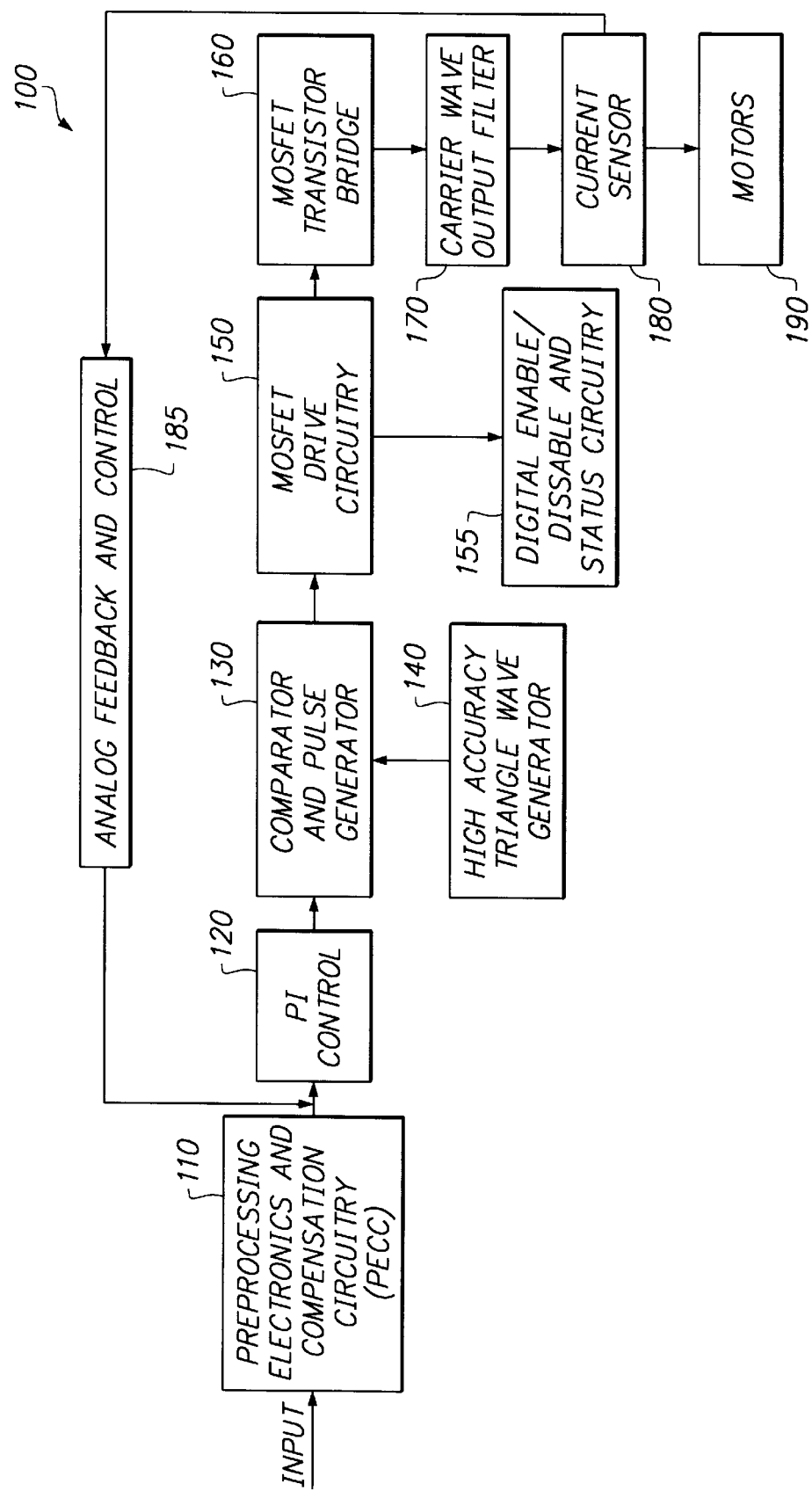
FIG. 1 is a block diagram of an embodiment of a pulse width modulation amplifier system in accordance with the present invention.

FIG. 1 is a block diagram of a PWM amplifier system 100 in accordance with the present invention. PWM amplifier system 100 receives an analog input signal and produces PWM signals to drive an inductive load, such as a motor at block 190.

As shown in FIG. 1, PWM amplifier system 100 contains a preprocessing electronics and compensation circuitry (PECC) block 110. The PECC block 110 interfaces between the PWM amplifier system 100 and an external analog source (not shown), which provides an analog input signal on line INPUT. The PECC block 110 also buffers the input signal and separates the PWM amplifier system 100 grounding system from the external analog source's electronics.

A proportioning and integration (PI) control block 120 is connected to PECC block 110. The PI control block 120 compensates for the characteristics of a moving motor response, such as low frequency roll-off. A current feedback signal generated at the analog feedback and control block 185 is provided to PI control block 120. The current feedback signal is used by PI control 120 block to stabilize and flatten the voltage to current transfer characteristics of PWM amplifier system 100. The current feedback signal also improves distortion characteristics, frequency response, and reduces noise in PWM amplifier system 100.

A comparator and pulse generation block 130 represents circuitry in PWM amplifier system 100 that generates a PWM timing signal. A high accuracy triangle wave generator block 140 provides a triangle waveform with a high degree of triangle linearity to be used as a natural sampling reference in comparator and pulse generation block 130.

MOSFET drive circuitry block 150 is configured to drive the gate capacitance in MOSFET transistor bridge block 160 in a strictly repeatable and fast manner. The MOSFET transistor bridge block 160 represents a low harmonic distortion H-bridge amplifier. The MOSFET drive circuitry block 150 also receives input from a digital enable/disable and status circuitry block 155, which is used to turn off PWM amplifier system 100.

The PWM signals generated by MOSFET transistor bridge block 160 are filtered at a carrier wave output filter block 170. Carrier wave output filter block 170 removes the carrier wave energy and dissipates it as heat. The carrier wave output filter block 170 provides an analog current signal to the current sensors block 180 and analog feedback and control block 185. Current sensor block 180 and analog feedback and control block 185 produce a current feedback signal to PI control block 120. Thus, PWM amplifier system 100 acts as a transimpedance amplifier or voltage to current amplifier. It is understood, however, that a voltage feedback signal can also be used resulting in a voltage to voltage amplifier.

Carrier wave output filter block 170 also provides the analog current signal to the motor block 190. Although the motor can be operated with non-filtered signals, the carrier wave energy would then be available as a heating mechanism within the linear motor, which is undesirable for high-precision stage control.

Figure 2:
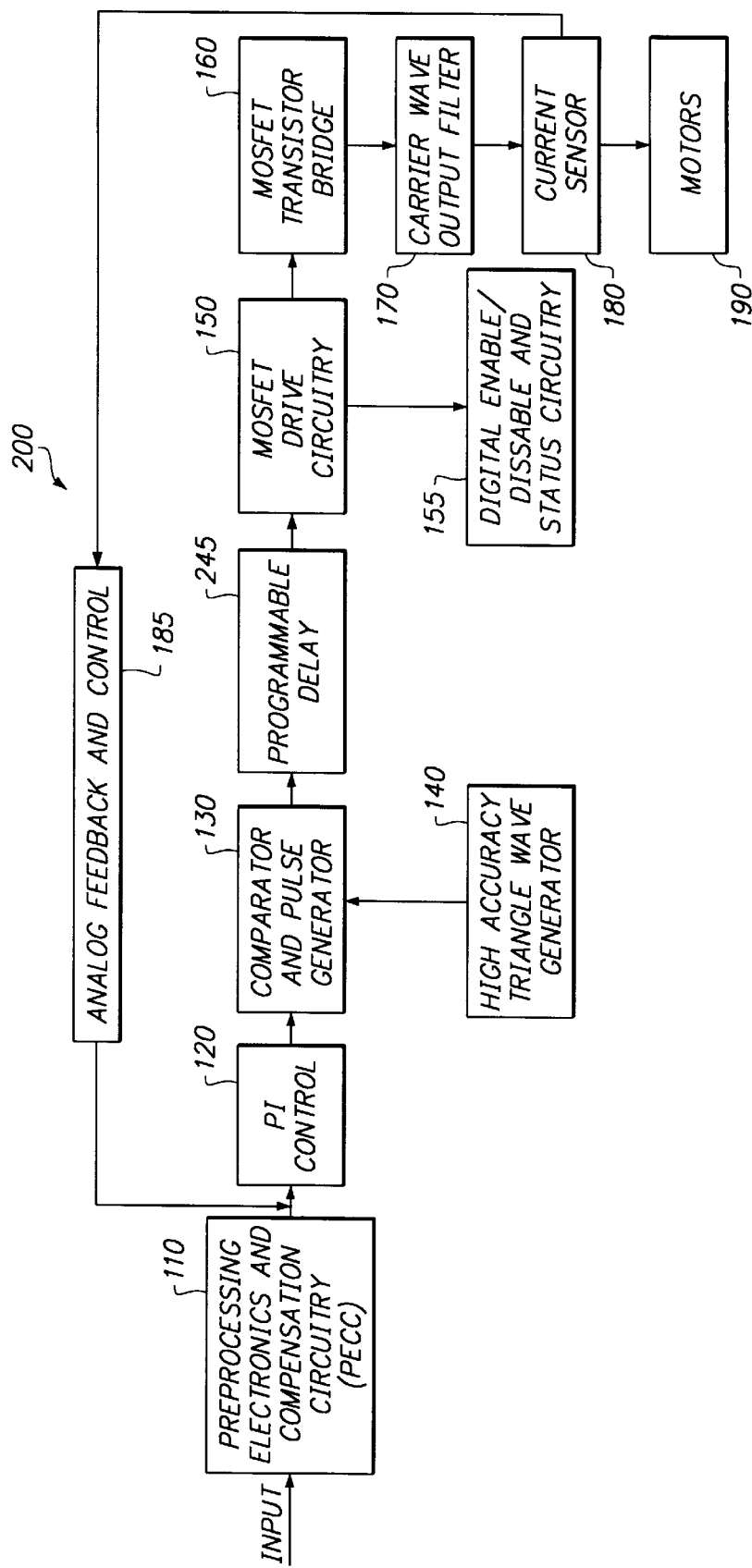
FIG. 2 is a block diagram of another embodiment of a pulse width modulation amplifier system using a programmable delay circuit on the pulse width signal in accordance with the present invention.

FIG. 2 is a block diagram of a PWM amplifier system 200 in accordance with another embodiment of the present invention. System 200 is similar to system 100 of FIG. 1, like-numbered blocks being the same. However, system 200 employs a programmable delay block 245 between comparator and pulse generator block 130 and MOSFET drive circuitry block 150. Programmable delay block 245 receives the timing signal from comparator and pulse generation block 130 and delays the edges of the PWM on/off wave forms, which controls dead time. Dead time is the delay time between the turn off of one half of MOSFET transistor bridge block 160 and the turn on of the other half. Programmable delay block 245 prevents the bus of the amplifier from being directly shunted to ground, a source of a significant amount of heat generation.

Figure 3:
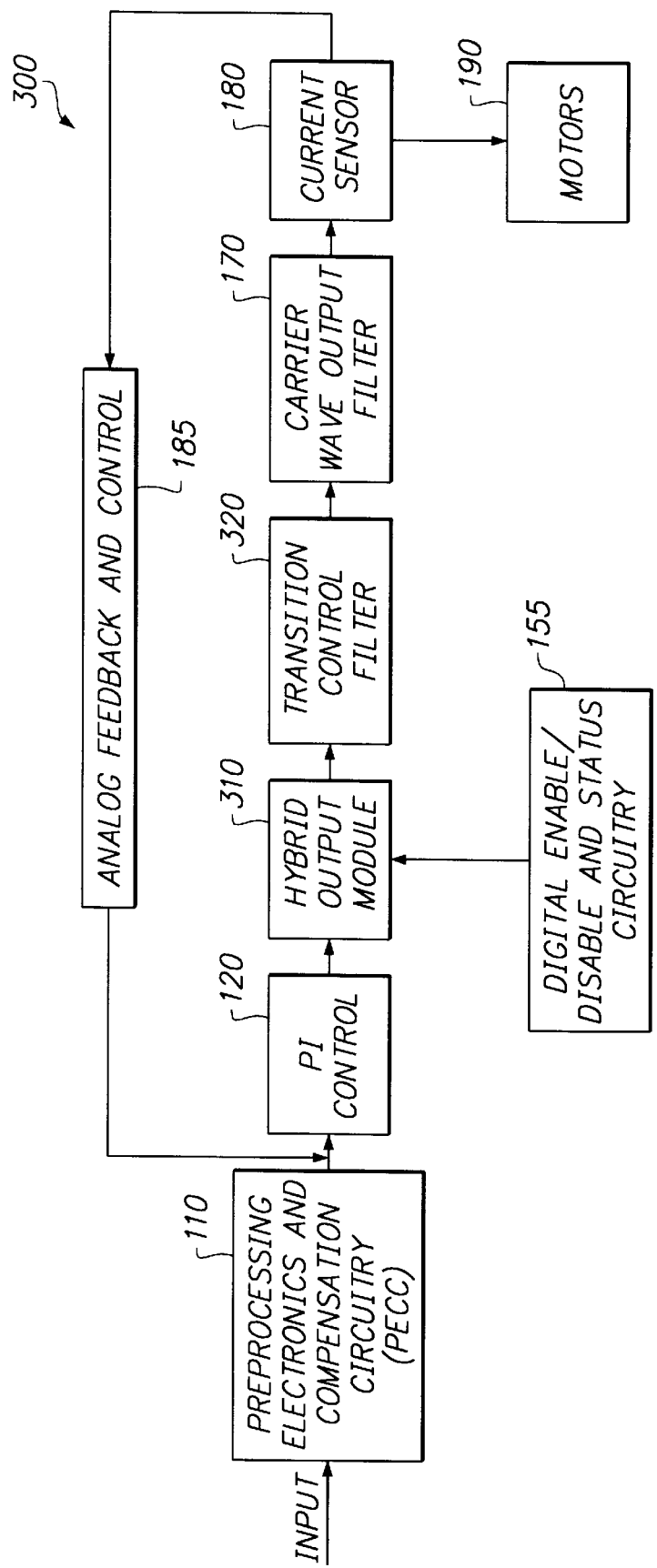
FIG. 3 is a block diagram of another embodiment of a pulse width modulation amplifier system in accordance with the present invention.

FIG. 3 is a block diagram of a PWM amplifier system 300 in accordance with another embodiment of the present invention. PWM amplifier system 300 is similar to PWM amplifier system 100 of FIG. 1, with like-numbered blocks being the same. However, PWM amplifier system 300 uses a hybrid output module block 310 as the driver circuitry. Hybrid output module block 310 replaces blocks 130, 140, 150, and 160 of PWM amplifier system 100. To control the transition shape of the rising and falling edge of the waveforms from hybrid output module block 310, a transition control filter block 320 is additionally used.

In the following description, for purposes of clarity and conciseness of the description, not all of the numerous components shown in the schematics are described. The numerous components are shown in the drawings to provide a person of ordinary skill in the art a thorough enabling disclosure of the present invention. It will be apparent to one skilled in the art that a detailed description of all of the specific components is not required in order for one of ordinary skill in the art to practice the present invention. Therefore, only those components that are affected by the present invention or that are necessary for an understanding of the present invention will be discussed. In addition, well-known electrical structures and circuits are shown in block diagram form in order to not obscure the present invention unnecessarily.

Figure 4:
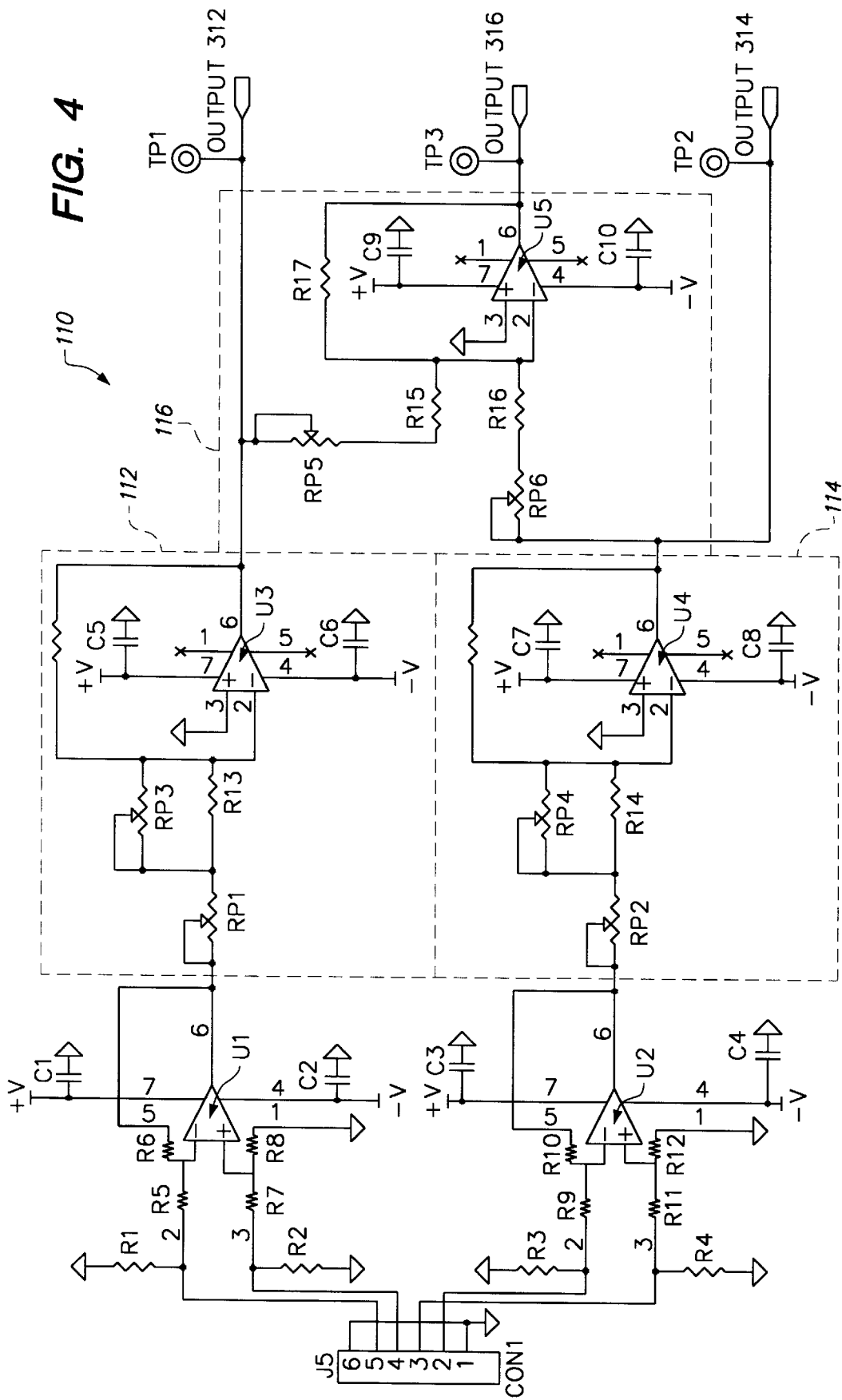
FIGS. 4–9 are detailed schematic diagrams of the pulse width modulated amplifier system in accordance with the present invention.

FIG. 4 is a schematic diagram illustrating one embodiment of PECC block 110 of PWM amplifier system 100. The analog signal from the external analog source is received at connector CON1. Buffers U1 and U2 buffer the input signals from connector CON1. Buffers U1 and U2 are selected for high common mode (noise) rejection, and thus possess good noise immunity.

The output signal of buffer U1 is received by a gain stage 112, which includes operational amplifier U3 and potentiometers RP1 and RP3. Likewise, the output signal of buffer U2 is received by a gain stage 114, which includes operational amplifier U4 and potentiometers RP2 and RP4. The output signals from gain stages 112 and 114 are received by a sum and gain stage 116, which includes operational amplifier U5 and potentiometers RP5 and RP6. Because three amplifiers are used to a motor controlling one axis, the amplifiers must be adjusted so that the gains match. Potentiometer RP3 is a course adjustment potentiometer provided to control the gain of amplifier U3 permitting gain matching of the different amplifiers for co-linear motor control. Potentiometer RP1 is a fine adjustment potentiometer that permits finer control of the gain of amplifier U3. Course and fine adjustment potentiometers RP4 and RP2 allow the gain of amplifier U3 to match the gain of amplifier U4, which produces an output signal phased at 120 degrees from gain stage 112.

Potentiometers RP5 and RP6 are used to control the gain of amplifier U5 of sum and gain stage 116. Stage 116 adds the output signals from gain stages 112 and 114, inverts the sum and then produces an output signal with a gain which is phased at 240 degrees from the output signal of gain stage 112. The output signals from gain stages 112, 114, and sum and gain stage 116 are transmitted via respective output terminals OUTPUT312, OUTPUT314, and OUTPUT316.

For clarity and to avoid redundancy in explanation, PWM amplifier system 100 will be described with reference to only the output signal produced by gain stage 112 and transmitted via output terminal OUTPUT 112. It is understood that the output signals from gain stage 114 and sum and gain stage 116 are treated in a similar manner by circuits similar to the circuits that will be described in reference to the output signal from gain stage 112. It is further understood that the output signals generated by gain stages 112, 114, and the sum and gain stage 116 are ultimately used to drive one three phase motor.

Figure 5:
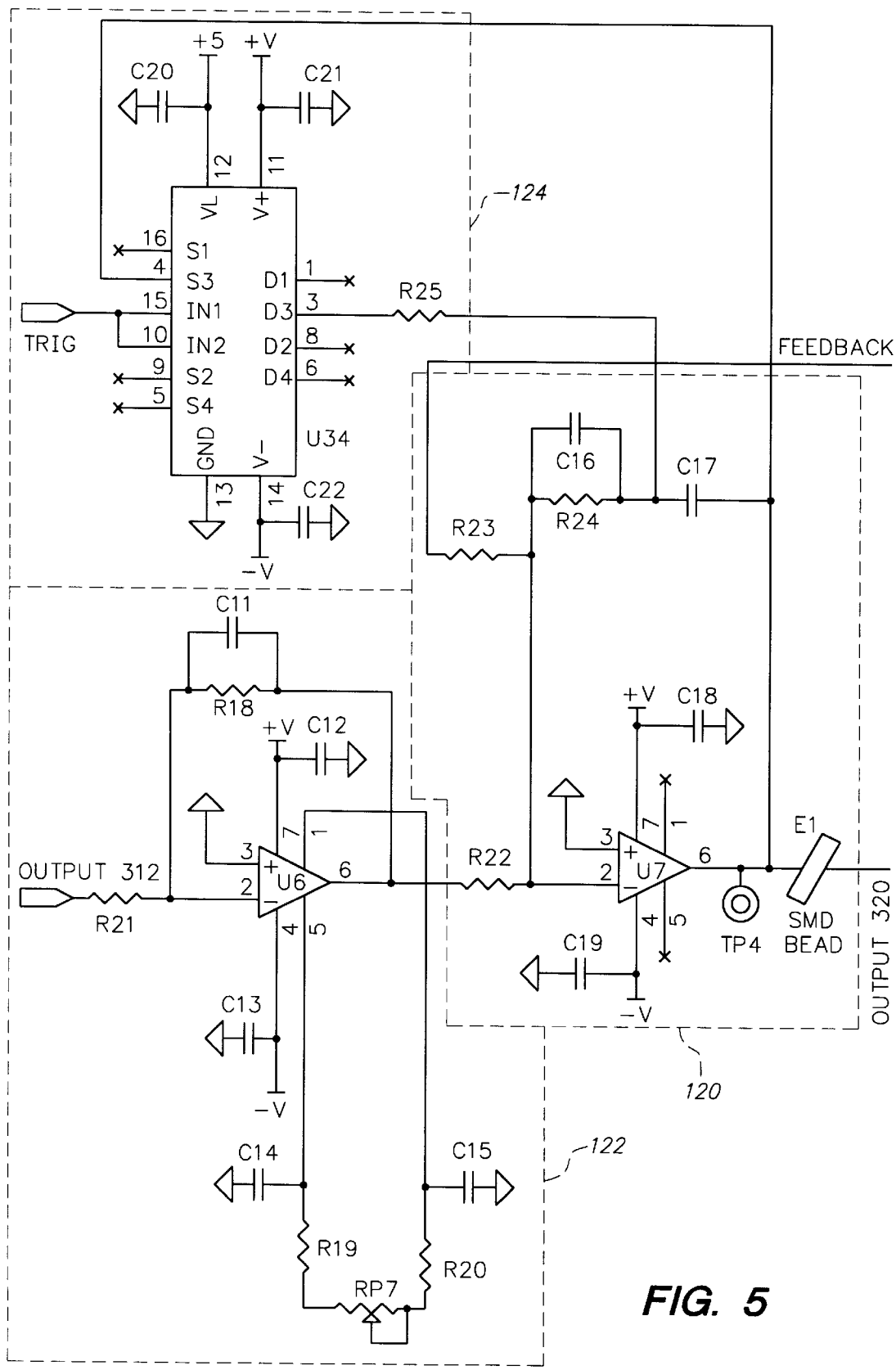

FIG. 5 is a schematic diagram illustrating an embodiment of the circuitry in PI control block 120 shown in the dashed line box of the same number. FIG. 5 also shows a buffer circuit in box 122. Buffer circuit 122 receives at OUTPUT312 the output signal from gain stage 112. Buffer U6 buffers adds offset to, and filters the output signal prior to integration in the PI control circuitry. The analog current signal from the analog feedback and control circuitry 185 is received by the PI control circuitry via line FEEDBACK. The proportional term from capacitor C16 and resistor R24 includes a high frequency roll off filter designed to be 1.6 KHz to improve system stability. The control signal from PI control circuit 120 is produced on line OUTPUT320.

Figure 6:
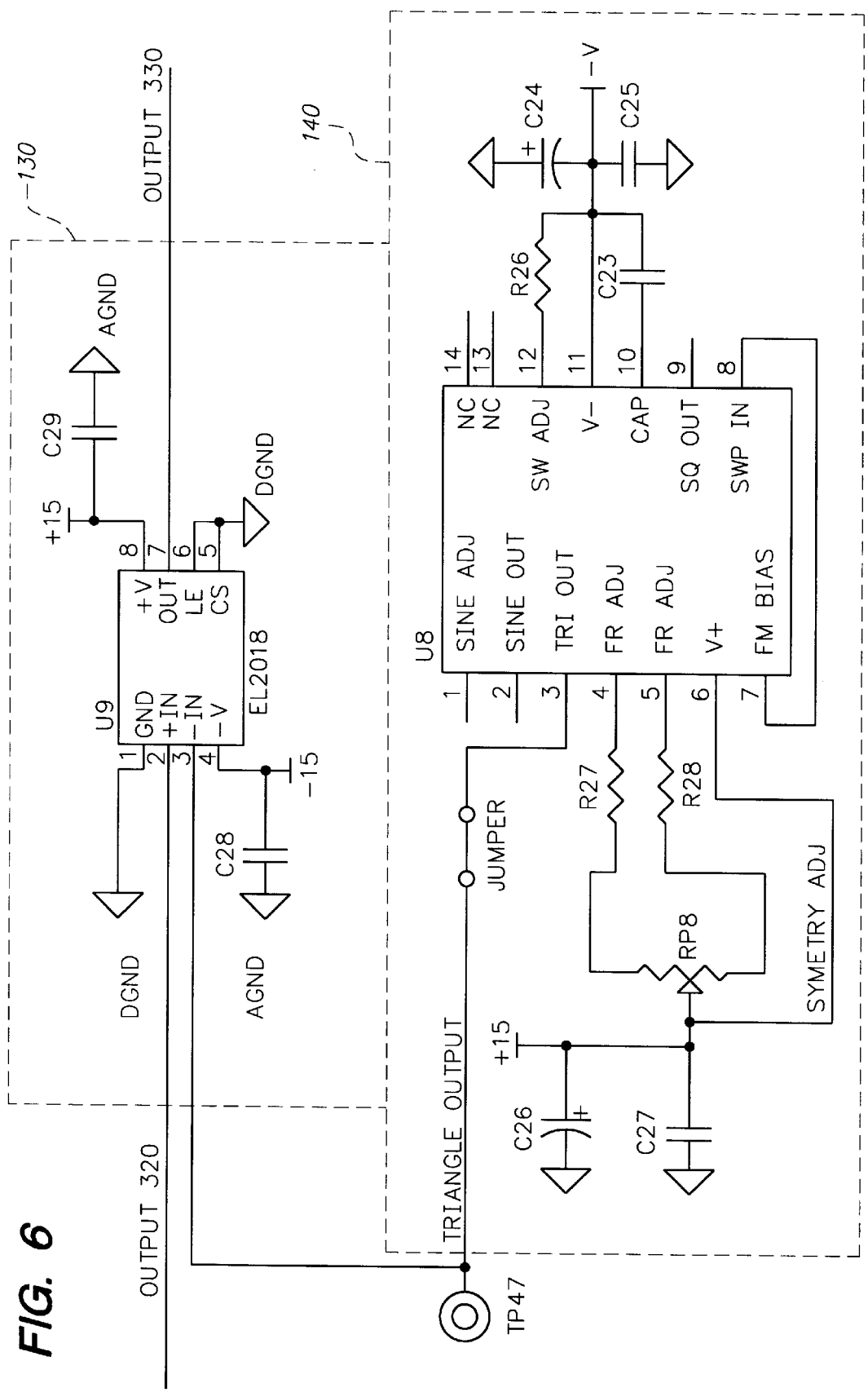

Comparator and pulse generator block 130 is shown schematically in FIG. 6, along with a high accuracy triangle wave generator block 140. The triangle wave generator U8 uses a Teflon 1000 pf capacitor C23 as the timing capacitor, which is selected for stability and low leakage values. Triangle wave generator U8 is a high grade component such as a model number ICL8038 IC, manufactured by Harris Semiconductor. The triangle wave generator U8 and timing capacitor C23 provide a high degree of triangle linearity, e.g., 0.05 percent. Potentiometer RP8 is used to adjust the symmetry of the triangle wave signal produced by triangle wave generator U8. Potentiometer RP8 is set by observing the triangle waveform on an FFT analyzer. Potentiometer RP8 is set so that the observed FFT represents a triangle wave as close as possible and so that the fundamental frequency is approximately 50 khz. The output signal of triangle wave generator U8 is a highly linear triangle waveform, which is received by comparator U9 via line TRIANGLE OUTPUT.

Comparator U9 is a fast comparator having a high slew rate. Model number EL2018, manufactured by Elantec, will suffice for this purpose. Comparator U9 is used to compare the control signal from PI control circuit 120 with the triangle waveform from triangle wave generator U8. Comparator U9 compares the control signal to the triangle waveform and produces a digitally pulsed timing signal on line OUTPUT330.

Figures 1, 7A:
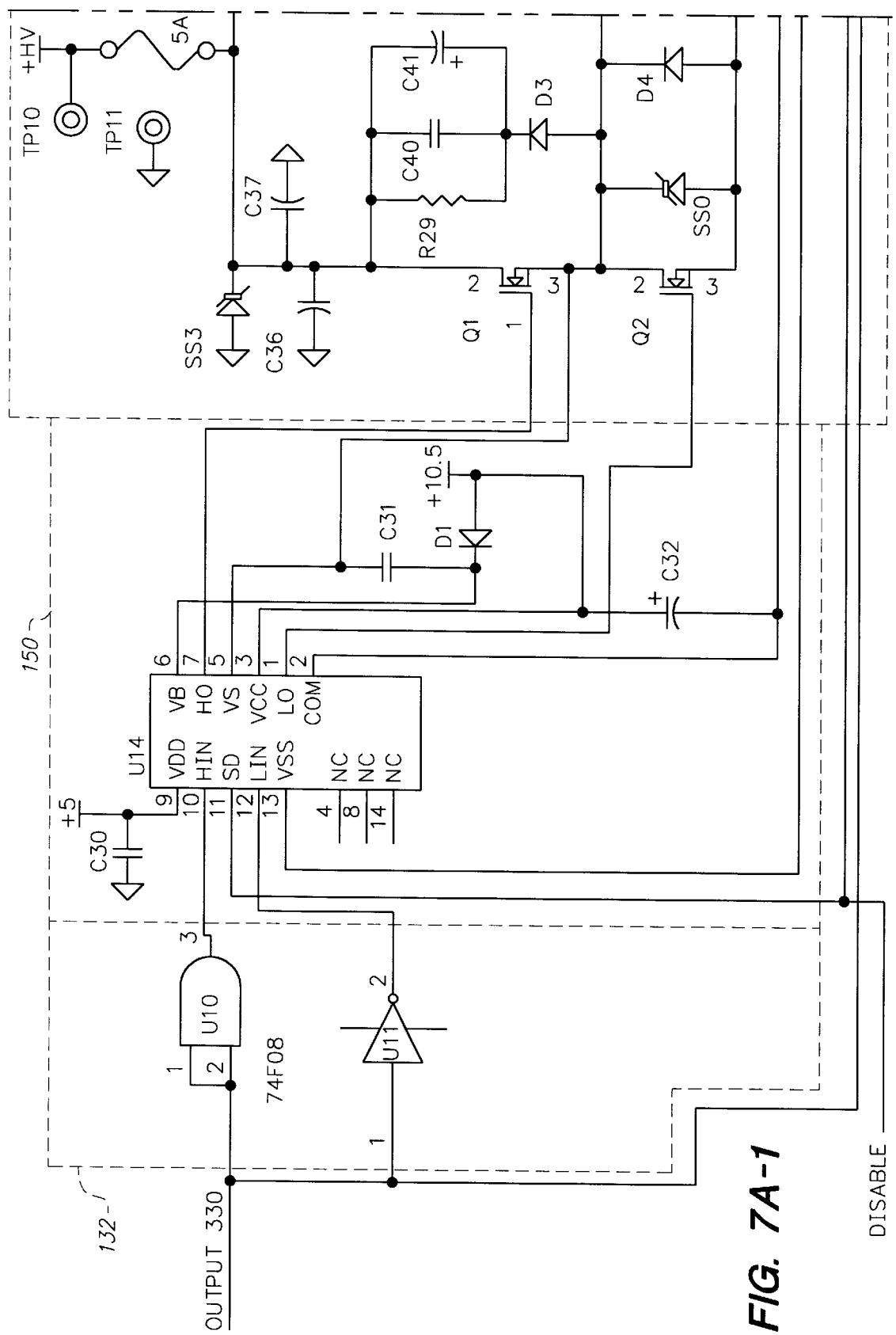
Figure 7A:
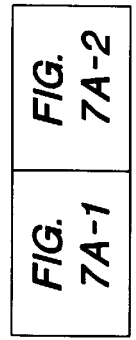
Figure 2:
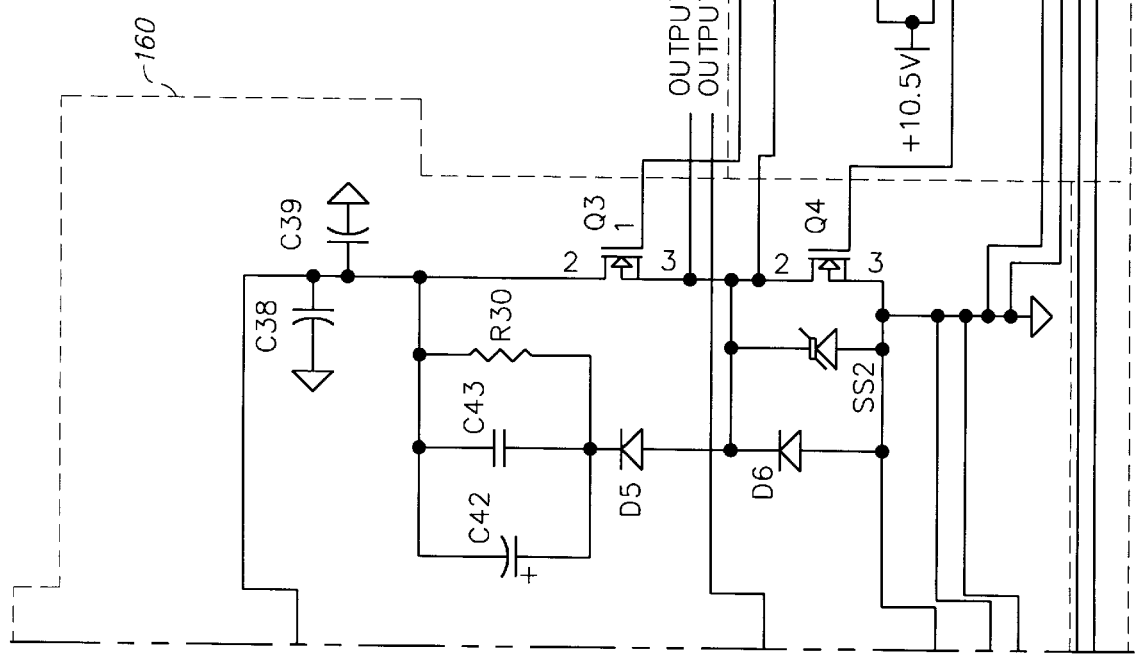

FIG. 7a is a schematic diagram illustrating the circuitry in a transistor to transistor logic (TTL) inverter block 132, MOSFET drive circuitry block 150, and MOSFET transistor bridge block 160. The digital output pulse on line OUTPUT330 is received by high speed inverters U11, U12 and high speed AND gates U10, U13 of TTL invertor block 132. The output terminal of inverter U11 is connected to the low input pin of MOSFET driver U14, while the output terminal of AND gate U10 is connected to the high input pin of MOSFET driver U14. The output terminals of inverter U12 and AND gate U13 are connected to respective high input and low input pins of MOSFET driver U15. MOSFET drivers U14, U15 also receive an enable/disable signal via line DISABLE from the circuitry comprising digital enable/disable and status block 155 shown in FIG. 8. The MOSFET drivers U14, U15 drive the gate capacitance of the MOSFETs in the MOSFET transistor bridge in a strictly repeatable and fast manner, e.g., less than 50 nsec. It is understood, however, that other circuit configurations to drive MOSFET transistor circuitry may also be used.

An H-bridge amplifier is used in MOSFET transistor bridge block 160. For a more detailed explanation of one suitable H-bridge amplifier, see the co-pending application Ser. No. 08/994,795, entitled "H-BRIDGE POWER AMPLIFIER FOR A MOTOR", with inventor Mark K. Takita, the contents of which are incorporated herein by this reference. The H-bridge amplifier includes four MOSFET switches Q1–Q4 interconnected with each other in an H configuration. The H-bridge amplifier produces PWM signal on lines OUTPUT360A and OUTPUT360B.

In selecting MOSFET transistors Q1–Q4, parameters to be considered to obtain good distortion performance and low heat dissipation are maximum drain current, and minimum forward on resistance. These are interrelated characteristics that are useful in reducing distortion characteristics. Additionally, the MOSFET input capacitance, which is interrelated to the speed of switching, and therefore amplifier efficiency, should have a minimum value. For example, a device of less than 2000 pF may be adequate. Further, the turn on and turn off times of the device should be minimized, by way of example, a range of 1 to 50 nsec may be used. By way of example, model number IRFS540A N-channel power transistors manufactured by Samsung may be used as transistors Q1–Q4. However, this device has an INPUT capacitance of 1320 pf. The turn off time can be reduced by providing turn off circuitry at the gate of each MOSFET, which is well within the skill of those in the art. In addition, the dead time, which is the time between one half of the transistor bridge turning off and the other half turning on, may be limited through the use of a programmable delay circuit or other delay elements as discussed further in reference to FIG. 11.

Fast surge or transient-voltage suppression is also necessary in the H-bridge amplifier in MOSFET transistor bridge block 160. The surge suppression insures protection against spikes larger than the specified drain-source voltage, which could result in destruction of the device. In addition, the surge suppression absorbs energy to insure a minimum amount of output ringing. Without surge suppression devices, high levels of distortion would be created because of the voltage spikes created by switching voltage to inductive loads, i.e., the motors. Voltage clamps, such as fast recovery diodes D3–D6 are connected to respective transistors Q1–Q4 in a reverse-current direction, from source to drain. Diodes such as model number MURS320T3, manufactured by Motorola, may be used for this purpose. In addition, unipolar surge suppressors SS1 and SS2 are connected to transistors Q2 and Q4 in a reverse-current direction, from source to drain. The unipolar surge suppressors SS1 and SS2 should be fast, conducting at speeds in excess of 1 psec ($10^{-12}$ sec), to dissipate fast energy transients. Surge suppressors such as 1.5KE120A, manufactured by General Instruments, may be used.

MOSFET transistor bridge block 160 also contains a power supply filter. Capacitors C36–C39 and surge suppresser SS3 suppress high frequency spike noise from being transmitted to the H-bride amplifier. Capacitors C37 and C38 are low ESR electrolytic capacitors, while capacitors C36 and C39 are low ESR polypropylene capacitors. Further, the power supply used in block 160 should be quiet in the region of the bandwidth under concern.

Figure 7B:
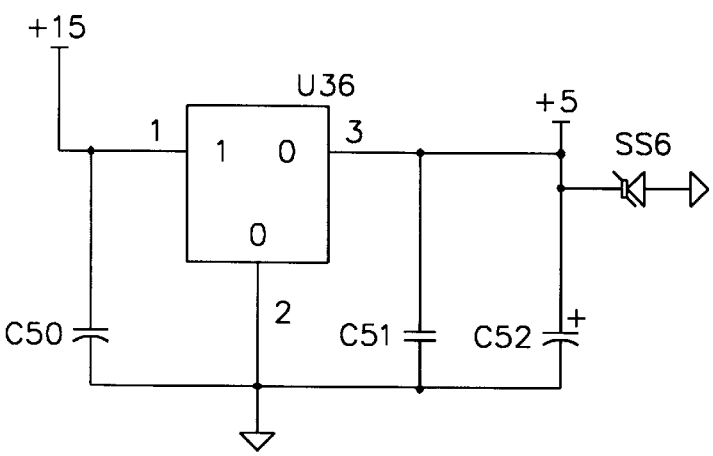
Figure 7C:
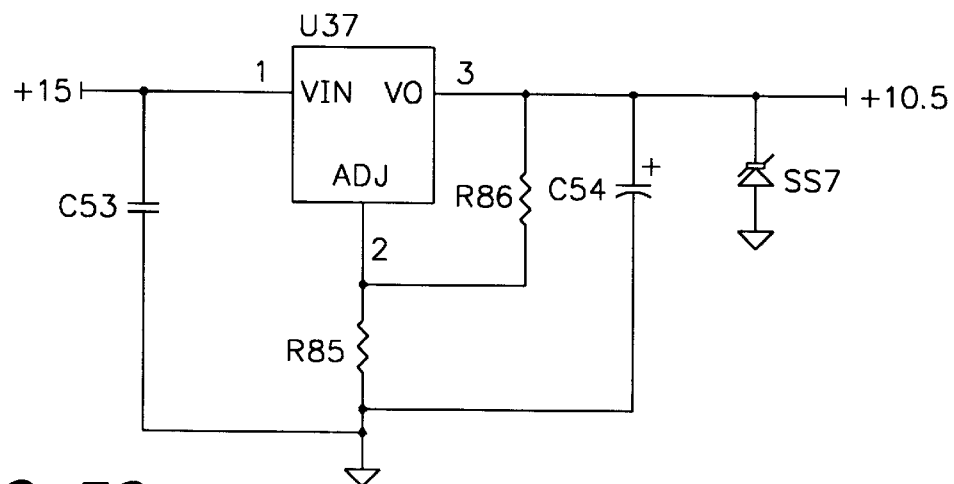

FIGS. 7B and 7C show voltage regulators used with MOSFET driver block 150.

Figures 1, 8:
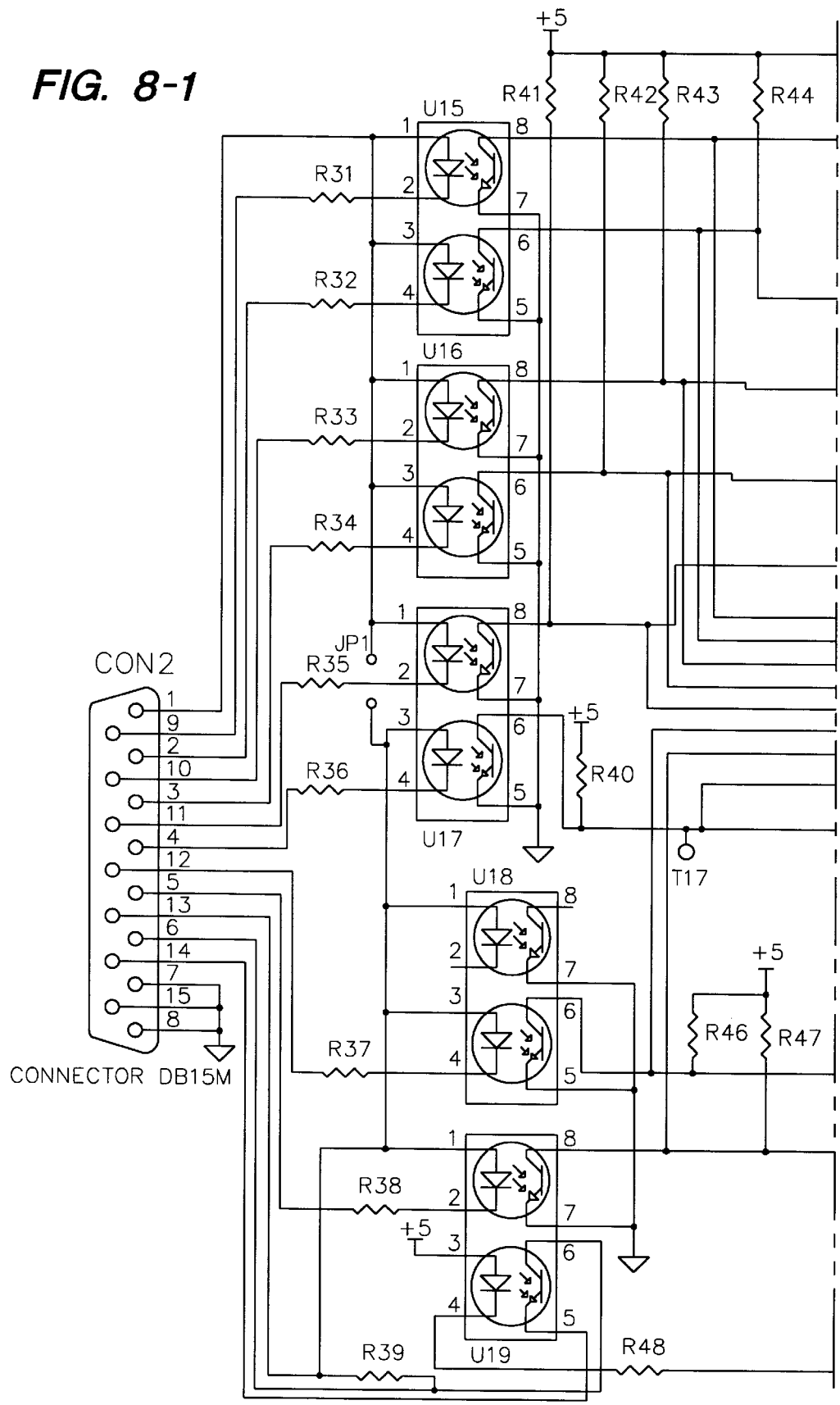
Figures 2, 8:
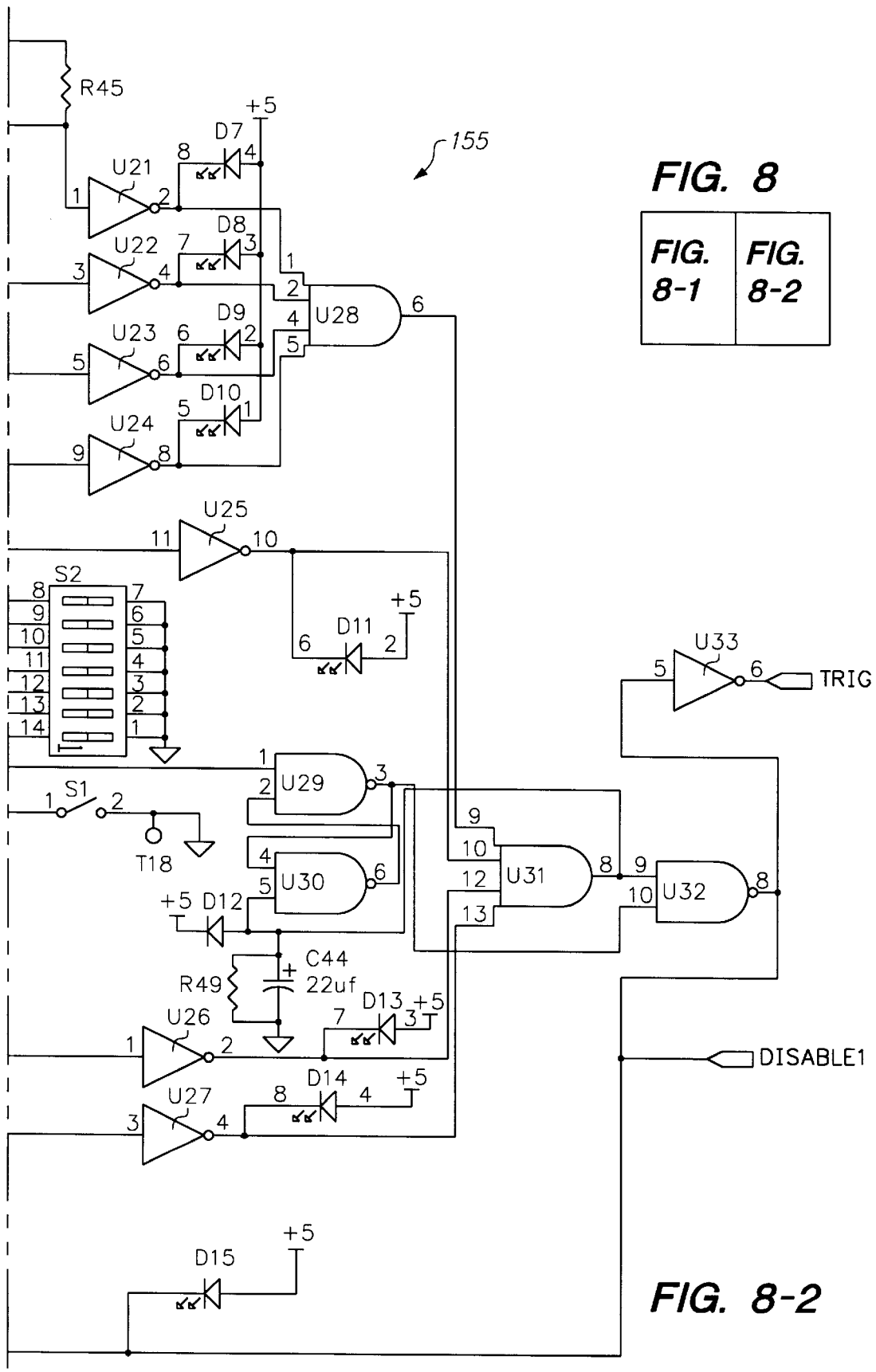

FIG. 8 is a schematic diagram of the digital enable/disable status of block 155. Digital enable/disable status circuitry 155 receives input signals at connector CON2 and produces disable signals on lines TRIG and DISABLE when the input signals at connector CON2 indicate that there is an abnormal situations, such as when there is excessive heat generation, the system is moving outside parameters, or during an emergency stop. The disable signal on line DISABLE is provided to MOSFET drivers U14 and U15, shown in FIG. 7a. The disable signal on line TRIG is provided to an analog switch U34 shown in box 124 of FIG. 5. Analog switch U34 is connected to PI control circuit 120 through resistor R25. Through this connection analog switch U34 can override PI control circuit 120.

Figure 9:
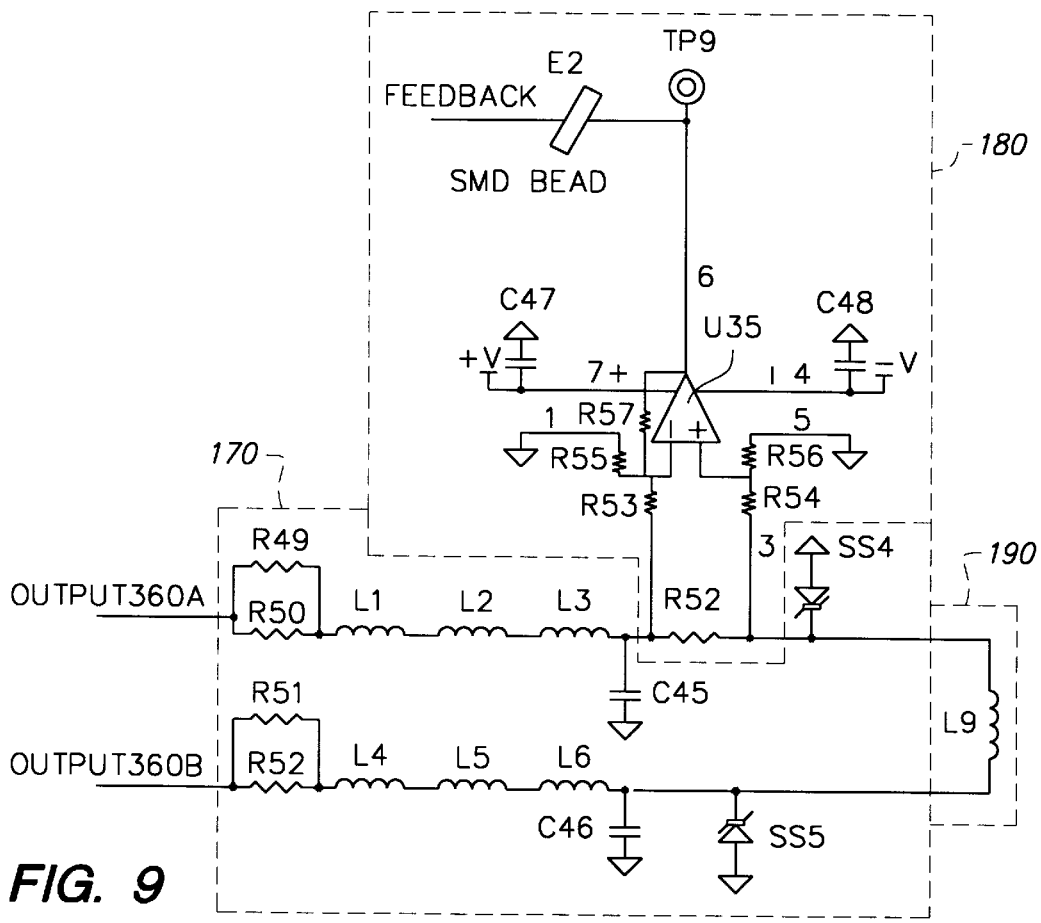

FIG. 9 illustrates a schematic view of carrier wave output filter block 170. The PWM signals from the MOSFET transistor bridge circuitry on lines OUTPUT360A and OUTPUT36OB are received by carrier wave output filters 170 shown in block 170. The carrier wave output filters 170 remove energy from the carrier waves and dissipate the energy as heat. Although the motors can operate without filtration, the carrier wave energy would heat the mechanism within the linear motors, which is undesirable. The capacitors C45, C46 are polypropylene capacitors, which are capable of rapid, high energy cycling. The resonant structure of the carrier wave output filter network should exceed the bandwidth of the system response, but also be below the switching frequency. In addition, the resonance peak should not exceed the system flat band gain tolerance. The motor represented by inductor L9 in block 190 receives the filtered analog current signals from the carrier wave output filters. In one embodiment, the motor in block 190 is a linear type motor, such as model number LM 110-4, manufactured by Trilogy, Inc.

Figure 14:
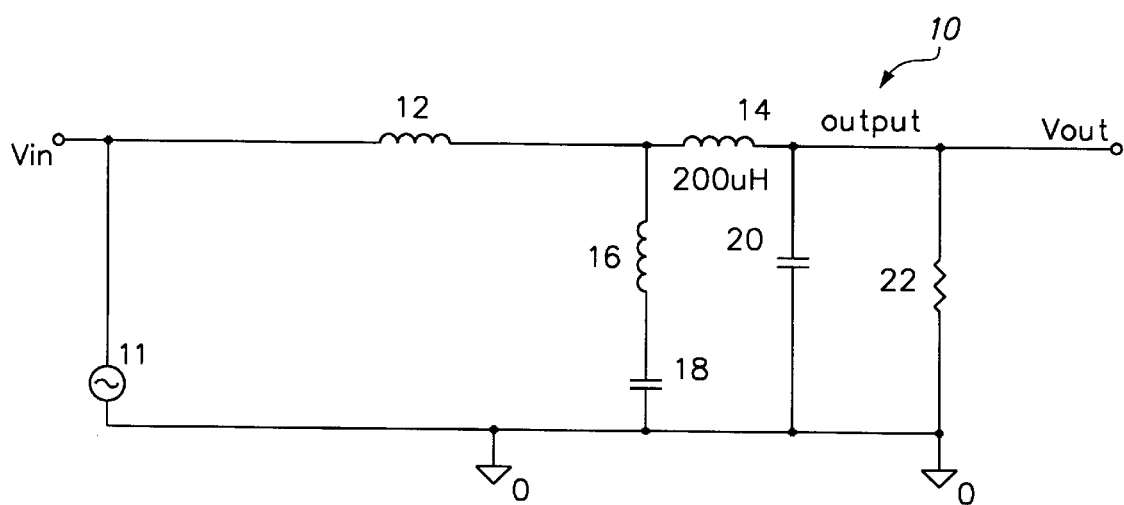
FIG. 14 is a conventional Cauer-Chebyshev filter circuit filter.
Figure 10:
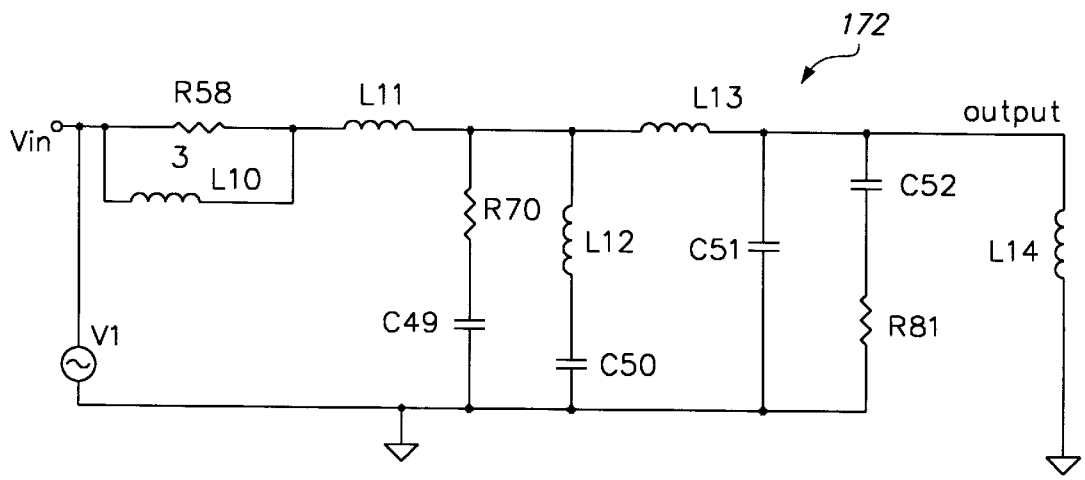
FIG. 10 is a detailed schematic diagram of an alternative carrier wave output filter to be used in the pulse width modulated amplifier system in accordance with the present invention.
Figure 11:
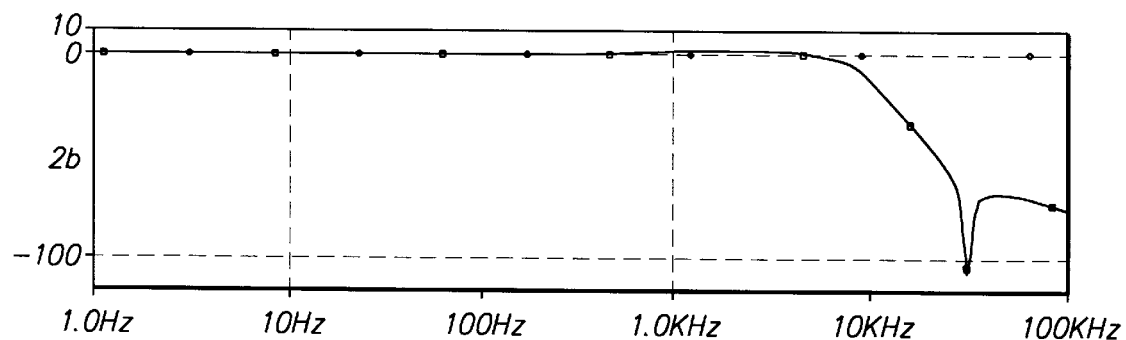
FIG. 11 is a plot showing the gain peaking of the alternative carrier wave output filter shown in FIG. 10 relative to frequency.
Figure 15:
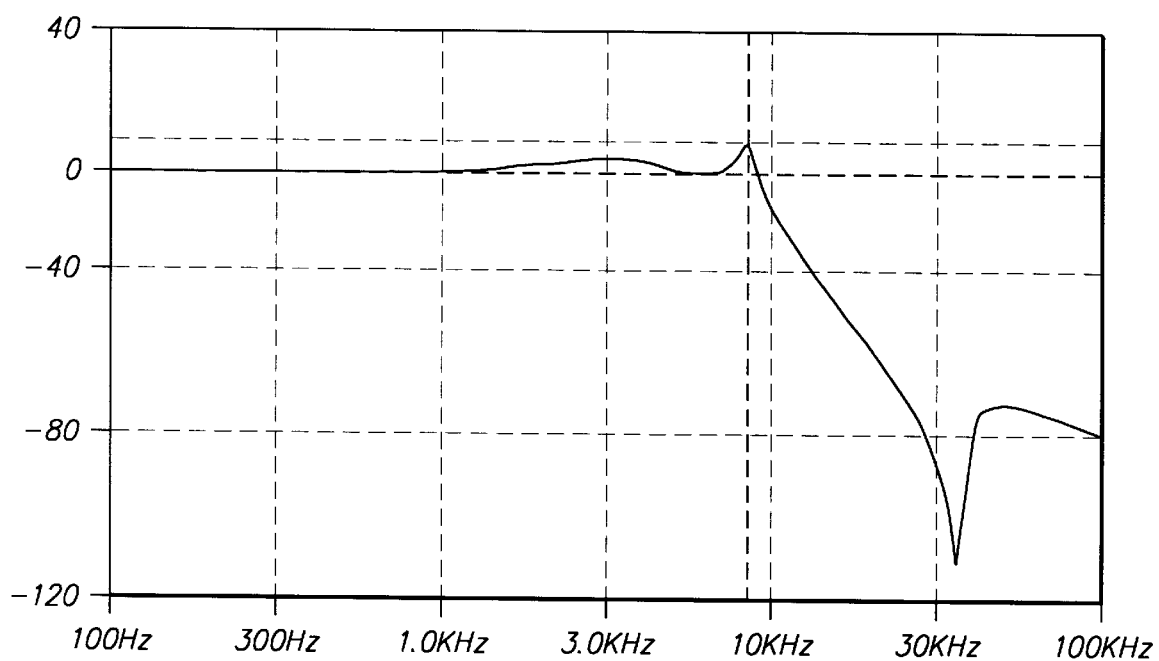
FIG. 15 is a plot showing the gain peaking of conventional Cauer-Chebyshev filter circuit relative to frequency.

FIG. 10 is a schematic of an alternative carrier wave output filter 172, which has an increased dynamic range. Filter 172 is a modified Cauer-Chebyshev elliptic filter where the load is represented by inductor L14. FIG. 11 is a plot showing the gain peaking of filter 172 relative to frequency. As shown in FIG. 11, filter 172 has very little gain peaking, with a gain peak of approximately 0.5 dB at 1.0 KHz. In comparison, the conventional Cauer-Chebyshev filter circuit 10, shown in FIG. 14, has a gain peak of approximately 8.5 dB at 10 KHz, as illustrated in the Pspice simulation results shown in FIG. 15. When an inductive load is connected, such as the linear type motor with model number LM 110-4, this "gain peaking," or resonance becomes even more pronounced. FIG. 15 is a plot showing the gain peaking of conventional filter circuit 10 relative to frequency, where conventional filter circuit 10 uses the same parameters as filter 172.

The carrier wave output filter of block 170 also provides an analog current signal to the current sensor block 180 and analog feedback and control block 185, which are both illustrated schematically in box 180 of FIG. 9. The feedback controller U35 produces the current feedback signal on line FEEDBACK, which is provided into PI control circuit 120 in FIG. 5. It is understood that a voltage feedback signal may alternatively be used in order to produce a voltage to voltage mode amplifier as is well understood by those skilled in the art.

Figure 12:
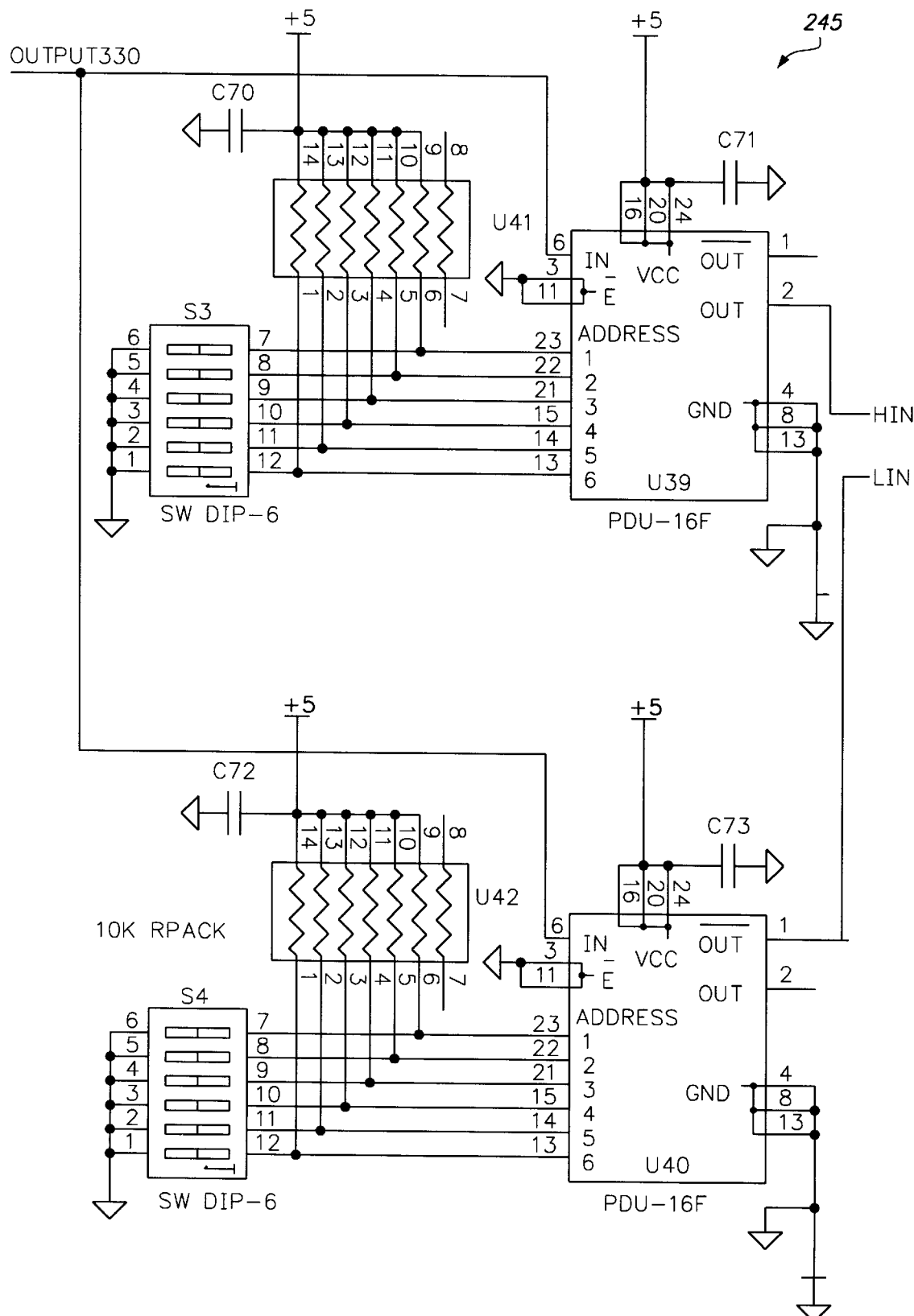
FIG. 12 is a detailed schematic diagram of a programmable delay circuit to be used with the pulse width modulated amplifier system in accordance with one embodiment of the present invention.

FIG. 12 is a schematic diagram of a programmable delay circuit 245 that replaces TTL inverter circuit 132 in FIG. 7a. Programmable delay circuit 245 includes a integrated programmable delay element U39, U40; resistor packs U41, U42; and switches S3, S4. Programmable delay circuit 245 receives the timing signal from comparator and pulse generation block 130 at terminal OUTPUT330 and is programmed to delay the edges of the PWM on/off waveforms from 5 nsec to 315 nsec in 5 nsec increments. By delaying the edges of the PWM waveform, the dead time may be minimized or affectively eliminated. Programmable delay circuit 245 produces the delayed PWM timing signal on the high input pin HIN and the low input pin LIN on the MOSFET driver U14, shown in FIG. 7A. A second programmable delay circuit (not shown) similarly produces a delayed PWM signal for the MOSFET driver U15 in FIG. 7A.

Figure 13:
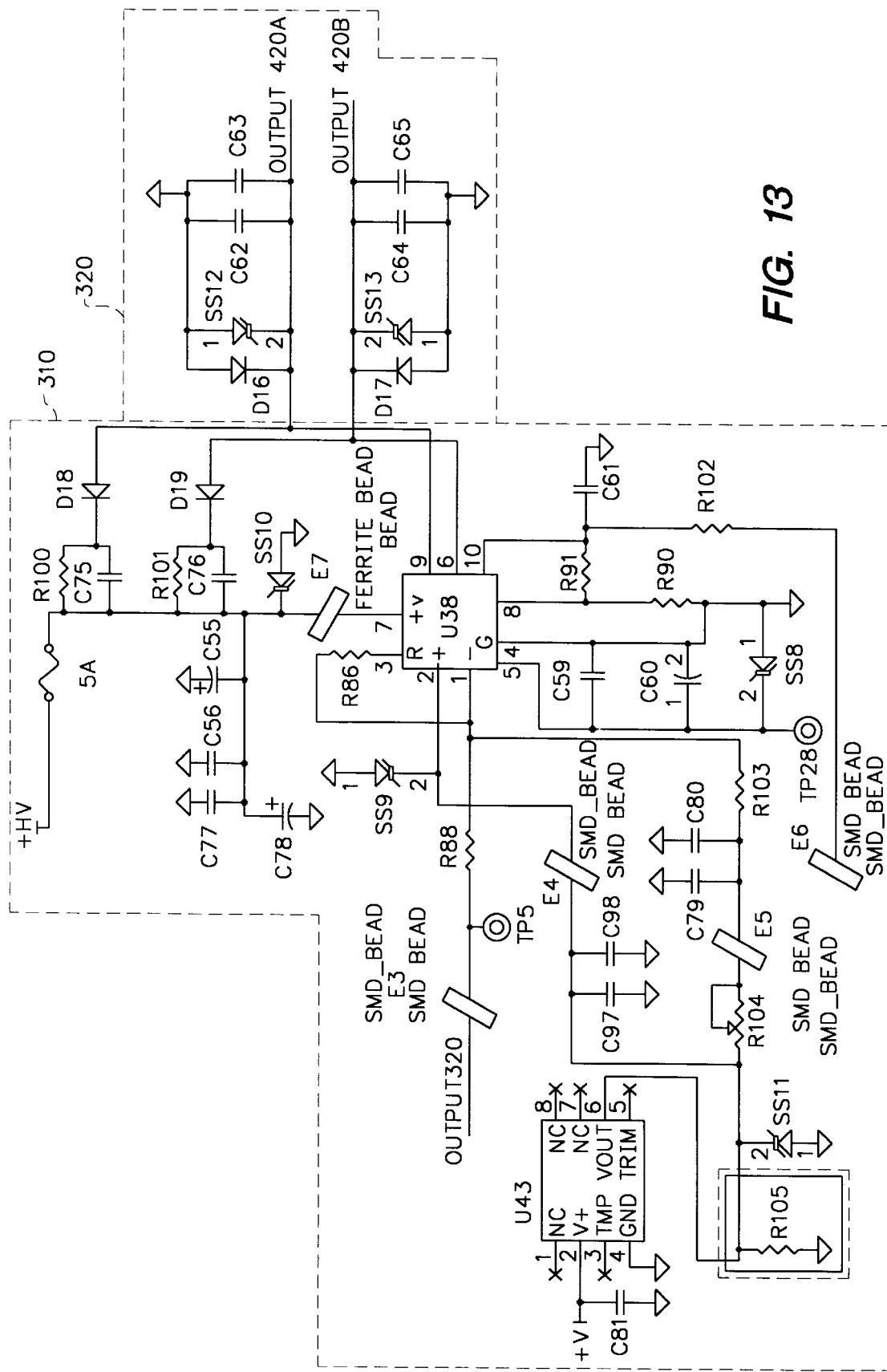
FIG. 13 is a detailed schematic diagram of an alternative hybrid amplifier output module to be used in the pulse width modulated amplifier system in accordance with one embodiment of the present invention.

FIG. 13 is a schematic diagram illustrating blocks 310 and 320 of a PWM amplifier system 300 in accordance with the embodiment of the present invention shown in FIG. 3. Block 310 replaces blocks 130, 132, 140, 150, and 160 shown in FIGS. 6 and 7A. A PWM amplifier U38, such as model number SA01, manufactured by Apex Microtechnology located in Tucson, Ariz. is used in block 310. This unit contains the PWM timing generation circuitry as well as the H-bridge output circuitry with high speed diodes SS12, SS13, D18, and D19. The output signals from amplifier U38 has a rising edge and a trailing edge with a transition time that varies with the depth of modulation of the pulsed wave. This creates high levels of distortion. To compensate for this effect, transition control filter block 320 is used.

Although the present invention has been described in considerable detail with reference to certain versions thereof, other versions are possible. For example, different carrier wave output filters may be used. Also, some components are shown directly connected to one another while others are shown connected via intermediate components. In each instance the method of interconnection establishes some desired electrical communication between two or more circuit nodes. Such communication may often be accomplished using a number of circuit configurations, as will be understood by those of ordinary skill in the art. Therefore, the spirit and scope of the appended claims should not be limited to the description of the versions depicted in the figures.

What is claimed is:

1. An amplifier system comprising:

a control circuit which receives an analog input signal and a feedback signal and outputs a control output signal;

a pulse generation circuit coupled to said control circuit, said pulse generation circuit receiving said control output signal and generating a pulsed timing signal;

a programmable delay circuit coupled to said pulse generation circuit, said programmable delay circuit receiving said pulsed timing signal and generating a delayed pulsed timing signal that has delayed edges of the pulsed timing signal waveform;

a transistor bridge circuit coupled to said programmable delay circuit, said transistor bridge circuit receiving said delayed pulsed timing signal and outputting a pulse width modulated signal;

a carrier wave output filter circuit coupled to said transistor bridge circuit, said carrier wave output filter circuit receiving said pulse width modulated signal and removing carrier wave energy from said pulse width modulated signal and outputting an analog output signal; and a feedback sensor circuit coupled to said carrier wave output filter circuit, said feedback sensor circuit receiving said analog output signal and outputting said feedback signal received by said control circuit.

2. The amplifier system of claim 1, wherein said feedback sensor circuit is a precision current sensor circuit outputting a current feedback signal and wherein said analog output signal is an analog current signal.

3. The amplifier system of claim 1 further comprising a preprocessing and compensation circuit which receives an external analog signal and buffers said external analog signal and outputs an analog input signal to said control circuit.

4. The amplifier system of claim 1 wherein said control circuit comprises a proportioning and integration circuit having a feedback input terminal, said feedback input terminal coupled to said feedback sensor circuit, said proportioning and integration circuit receiving said feedback signal and filtering said feedback signal.

5. The amplifier system of claim 1 wherein said pulse generation circuit comprises:
   a triangle wave generator which produces a triangle waveform signal; and
   a comparator coupled to receive said control signal and said triangle waveform signal and outputting a timing signal from a comparison between said control signal and said triangle waveform signal.

6. The amplifier system of claim 5, wherein said pulse generation circuit further comprises a symmetry adjust circuit coupled to said triangle waveform generator, said symmetry adjust circuit adjusting said triangle waveform signal for symmetry.

7. The amplifier system of claim 1, wherein said transistor bridge circuit comprises an H-bridge amplifier.

8. The amplifier system of claim 7, wherein said transistor bridge circuit comprises:
   an amplifier having a first and second input nodes;
   a first transistor having a control terminal connected to said first input node, a first current-handling terminal connected to a first voltage potential, and a second current-handing terminal connected to a first output terminal;
   a second transistor having a control terminal connected to said second input node, a first current-handling terminal connected to a second voltage potential, and a second current-handing terminal connected to a second output terminal;
   a voltage clamp connected between the first and second current-handling terminals of said first transistor;
   a transient-voltage suppresser connected between the first and second current-handling terminals of said second transistor; and wherein
   said first and second output terminals are connected to said carrier wave output filter circuit.

9. The amplifier of claim 1, wherein said motor is coupled to receive said analog output signal from said carrier wave output filter circuit.

10. The amplifier system of claim 1, wherein said carrier wave output filter circuit comprises:
    a first inductive element having a first node and a second node, said first node of said first inductive element being coupled to said transistor bridge circuit;
    a first resistive element coupled between said first and second nodes of said first inductive element, said first resistive element being coupled in parallel with said first inductive element;
    a second inductive element having a first node and a second node, said first node of said second inductive element being coupled to said second node of said first inductive element;
    a second resistive element coupled in series to a first capacitive element, said second resistive element and said first capacitive element being coupled between said second terminal of said second inductive element and a constant voltage source;
    a third inductive element coupled in series to a second capacitive element, said third inductive element and said second capacitive element being coupled between said second terminal of said second inductive element and said constant voltage source;
    a fourth inductive element having a first node and a second node, said first node of said fourth inductive element being coupled to said second node of said second inductive element, and said second node of said fourth inductive element being coupled to said feedback sensor circuit;
    a third capacitive element coupled between said second node of said fourth capacitive element and said constant voltage source; and
    a fourth capacitive element coupled in series to a third resistive element, said fourth capacitive element and said third resistive element being coupled between said second terminal of said fourth inductive element and said constant voltage source.

11. A method of driving a motor comprising:
    receiving an analog input signal;
    generating a control signal based on said analog input signal and a feedback signal;
    providing a reference signal;
    comparing said control signal and said reference signal and producing a pulsed timing signal;
    delaying at least one of the edges of the pulsed timing signal waveform and producing a delayed pulsed timing signal;
    generating a pulse modulated signal based on said delayed pulsed timing signal;
    filtering carrier wave energy from said pulse modulated signal and producing an analog output signal; and
    producing a feedback signal based on said analog output signal and providing said feedback signal to be combined with said analog input signal.

12. The method of claim 11, wherein said analog output signal is an analog current signal.

13. The method of claim 11, wherein said reference signal is a triangle wave signal, said method further comprising adjusting the symmetry of said triangle wave signal.

14. An amplifier system comprising:
    a control circuit which receives an analog input signal and a feedback signal and outputs a control output signal;
    a pulse generation circuit coupled to said control circuit, said pulse generation circuit receiving said control output signal and generating a pulsed timing signal;
    a transistor bridge circuit coupled to said pulse generation circuit, said transistor bridge circuit receiving said pulsed timing signal and outputting a pulse width modulated signal;
    a carrier wave output filter circuit coupled to said transistor bridge circuit, said carrier wave output filter circuit receiving said pulse width modulated signal and removing carrier wave energy from said pulse width modulated signal and outputting an analog output signal; and a feedback sensor circuit coupled to said carrier wave output filter circuit, said feedback sensor circuit receiving said analog output signal and outputting said feedback signal received by said control circuit; and wherein said transistor bridge circuit comprises:

an amplifier having a first and second input nodes;

a first transistor having a control terminal connected to said first input node, a first current-handling terminal connected to a first voltage potential, and a second current-handing terminal connected to a first output terminal;

a second transistor having a control terminal connected to said second input node, a first current-handling terminal connected to a second voltage potential, and a second current-handing terminal connected to a second output terminal;

a voltage clamp connected between the first and second current-handling terminals of said first transistor;

a transient-voltage suppresser connected between the first and second current-handling terminals of said second transistor; and wherein said first and second output terminals are connected to said carrier wave output filter circuit.

15. An amplifier system comprising:

a control circuit which receives an analog input signal and a feedback signal and outputs a control output signal;

a pulse generation circuit coupled to said control circuit, said pulse generation circuit receiving said control output signal and generating a pulsed timing signal;

a transistor bridge circuit coupled to said pulse generation circuit, said transistor bridge circuit receiving said pulsed timing signal and outputting a pulse width modulated signal;

a carrier wave output filter circuit coupled to said transistor bridge circuit, said carrier wave output filter circuit receiving said pulse width modulated signal and removing carrier wave energy from said pulse width modulated signal and outputting an analog output signal; and a feedback sensor circuit coupled to said carrier wave output filter circuit, said feedback sensor circuit receiving said analog output signal and outputting said feedback signal received by said control circuit; and wherein said carrier wave output filter circuit comprises:

a first inductive element having a first node and a second node, said first node of said first inductive element being coupled to said transistor bridge circuit;

a first resistive element coupled between said first and second nodes of said first inductive element, said first resistive element being coupled in parallel with said first inductive element;

a second inductive element having a first node and a second node, said first node of said second inductive element being coupled to said second node of said first inductive element;

a second resistive element coupled in series to a first capacitive element, said second resistive element and said first capacitive element being coupled between said second terminal of said second inductive element and a constant voltage source;

a third inductive element coupled in series to a second capacitive element, said third inductive element and said second capacitive element being coupled between said second terminal of said second inductive element and said constant voltage source;

a fourth inductive element having a first node and a second node, said first node of said fourth inductive element being coupled to said second node of said second inductive element, and said second node of said fourth inductive element being coupled to said feedback sensor circuit;

a third capacitive element coupled between said second node of said fourth capacitive element and said constant voltage source; and a fourth capacitive element coupled in series to a third resistive element, said fourth capacitive element and said third resistive element being coupled between said second terminal of said fourth inductive element and said constant voltage source.

* * * * *

UNITED STATES PATENT AND TRADEMARK OFFICE
CERTIFICATE OF CORRECTION

PATENT NO.   : 6,064,259
ISSUE DATE   : May 16, 2000
INVENTOR     : Mark K. Takita It is certified that error appears in the above-identified patent and that said Letters Patent is hereby corrected as shown below:

[73] Assignee: Nikon Corporation

Signed and Sealed this

Twenty-fourth Day of April, 2001

Attest:

NICHOLAS P. GODICI

Attesting Officer

Acting Director of the United States Patent and Trademark Office